(12) United States Patent
Lin et al.

(10) Patent No.: US 11,474,392 B2
(45) Date of Patent: *Oct. 18, 2022

(54) DISPLAY DEVICE

(71) Applicant: InnoLux Corporation, Miao-Li County (TW)

(72) Inventors: Hsiao-Lang Lin, Miao-Li County (TW); Jia-Yuan Chen, Miao-Li County (TW); Jui-Jen Yueh, Miao-Li County (TW); Kuan-Feng Lee, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/333,032

(22) Filed: May 28, 2021

(65) Prior Publication Data

US 2021/0286207 A1   Sep. 16, 2021

Related U.S. Application Data

(63) Continuation of application No. 16/262,935, filed on Jan. 31, 2019, now Pat. No. 11,048,117, which is a
(Continued)

(51) Int. Cl.
*G02F 1/13357* (2006.01)
*G02F 1/1335* (2006.01)
(Continued)

(52) U.S. Cl.
CPC ...... *G02F 1/1336* (2013.01); *G02F 1/133514* (2013.01); *G06F 1/1601* (2013.01); *G06F 3/0412* (2013.01); *G09G 3/20* (2013.01);

*H01L 27/322* (2013.01); *H01L 27/3213* (2013.01); *H01L 27/3216* (2013.01); *H01L 27/3218* (2013.01); *G02F 1/133562* (2021.01);
(Continued)

(58) Field of Classification Search
CPC ............. G02F 1/1336; G02F 1/133514; G02F 2202/36; G02F 2001/133616; G02F 2001/133614; G02F 2203/30; G09G 3/3607

See application file for complete search history.

(56) References Cited

U.S. PATENT DOCUMENTS 10,234,722 B2 * 3/2019 Lin .................. G06F 1/1601
11,048,117 B2 * 6/2021 Lin .................. H01L 27/3216

* cited by examiner

*Primary Examiner* — Anne M Hines
*Assistant Examiner* — Jose M Diaz
(74) *Attorney, Agent, or Firm* — Winston Hsu

(57) ABSTRACT

A display device includes a first display unit emitting a green light that has a first output spectrum corresponding to a highest gray level of the display device, and a second display unit emitting a blue light that has a second output spectrum corresponding to the highest gray level of the display device. An intensity integral of the first output spectrum within a range from 380 nm to 780 nm is defined as a first intensity integral. An intensity integral of the second output spectrum within a range from 511 nm to 597 nm is defined as a second intensity integral. A ratio of the second intensity integral to the first intensity integral is defined as a first ratio, and the first ratio is greater than 0% and less than or equal to 25.0%.

20 Claims, 12 Drawing Sheets

Related U.S. Application Data continuation of application No. 16/100,220, filed on Aug. 10, 2018, now Pat. No. 10,234,722, which is a continuation of application No. 15/662,256, filed on Jul. 27, 2017, now Pat. No. 10,073,294.

(60) Provisional application No. 62/500,539, filed on May 3, 2017, provisional application No. 62/479,326, filed on Mar. 31, 2017.

(51) Int. Cl.
*G09G 3/20* (2006.01)
*H01L 27/32* (2006.01)
*G06F 1/16* (2006.01)
*G06F 3/041* (2006.01)
*G09G 3/36* (2006.01)
*H01L 51/52* (2006.01)

(52) U.S. Cl.
CPC .. *G02F 1/133603* (2013.01); *G02F 1/133614* (2021.01); *G02F 1/133616* (2021.01); *G02F 2201/52* (2013.01); *G02F 2202/36* (2013.01); *G02F 2203/30* (2013.01); *G06F 2203/04102* (2013.01); *G06F 2203/04111* (2013.01); *G06F 2203/04112* (2013.01); *G09G 3/3607* (2013.01); *G09G 2300/0452* (2013.01); *H01L 27/323* (2013.01); *H01L 51/5284* (2013.01)

DISPLAY DEVICE

CROSS REFERENCE TO RELATED APPLICATIONS

This patent application is a continuation application and claims priority of U.S. patent application Ser. No. 16/262,935, filed on Jan. 31, 2019, which is a continuation application and claims priority of U.S. patent application Ser. No. 16/100,220, field on Aug. 10, 2018, which is a continuation application and claims priority of U.S. patent application Ser. No. 15/662,256, filed on Jul. 27, 2017, which claims the benefit of U.S. provisional application No. 62/479,326, filed Mar. 31, 2017, and claims the benefit of U.S. provisional application No. 62/500,539, filed May 3, 2017, and the entire contents of which are incorporated herein by reference.

BACKGROUND OF THE DISCLOSURE

1. Field of the Disclosure

The present disclosure relates to a display device, and more particularly to a display device for improving the display in low luminance viewing conditions by adjusting colors.

2. Description of the Prior Art

Nowadays, display devices have advantages of portability, low power consumption, and low radiation. Therefore, they are widely used in various information products, such as desktop computers, notebooks, smart phones, car displays and head up displays.

In general, human eyes have three types of visions according to different luminance viewing conditions: photopic vision in the high luminance viewing condition, scotopic vision (dark vision) in the low luminance viewing condition, and mesopic vision (middle vision) in the low luminance viewing condition. The mesopic vision is a combination or a transition of the photopic vision and the scotopic vision. However, the conventional display devices are usually designed for photopic vision of human eyes. In other words, the conventional display devices are disadvantageous for the users to view pictures or images with the scotopic vision or the mesopic vision. Therefore, the quality of watching the pictures or images would be affected in low luminance viewing conditions.

SUMMARY OF THE DISCLOSURE

A display device is provided. The display device includes a first display unit emitting a green light that has a first output spectrum corresponding to a highest gray level of the display device, and a second display unit emitting a blue light that has a second output spectrum corresponding to the highest gray level of the display device. An intensity integral of the first output spectrum within a range from 380 nm to 780 nm is defined as a first intensity integral. An intensity integral of the second output spectrum within a range from 511 nm to 597 nm is defined as a second intensity integral. A ratio of the second intensity integral to the first intensity integral is defined as a first ratio, and the first ratio is greater than 0% and less than or equal to 25.0%.

A display device includes a first display unit emitting a red light having a first output spectrum corresponding to a highest gray level of the display device, and a second display unit emitting a blue light having a second output spectrum corresponding to the highest gray level of the display device. An intensity integral of the first output spectrum within a range from 380 nm to 780 nm is defined as a first intensity integral, an intensity integral of the second output spectrum within a range from 494 nm to 580 nm is defined as a second intensity integral, a ratio of the second intensity integral to the first intensity integral is greater than 0% and less than or equal to 28.0%.

These and other objectives of the present disclosure will no doubt become obvious to those of ordinary skill in the art after reading the following detailed description of the embodiment that is illustrated in the various figures and drawings.

DETAILED DESCRIPTION

Figure 1:
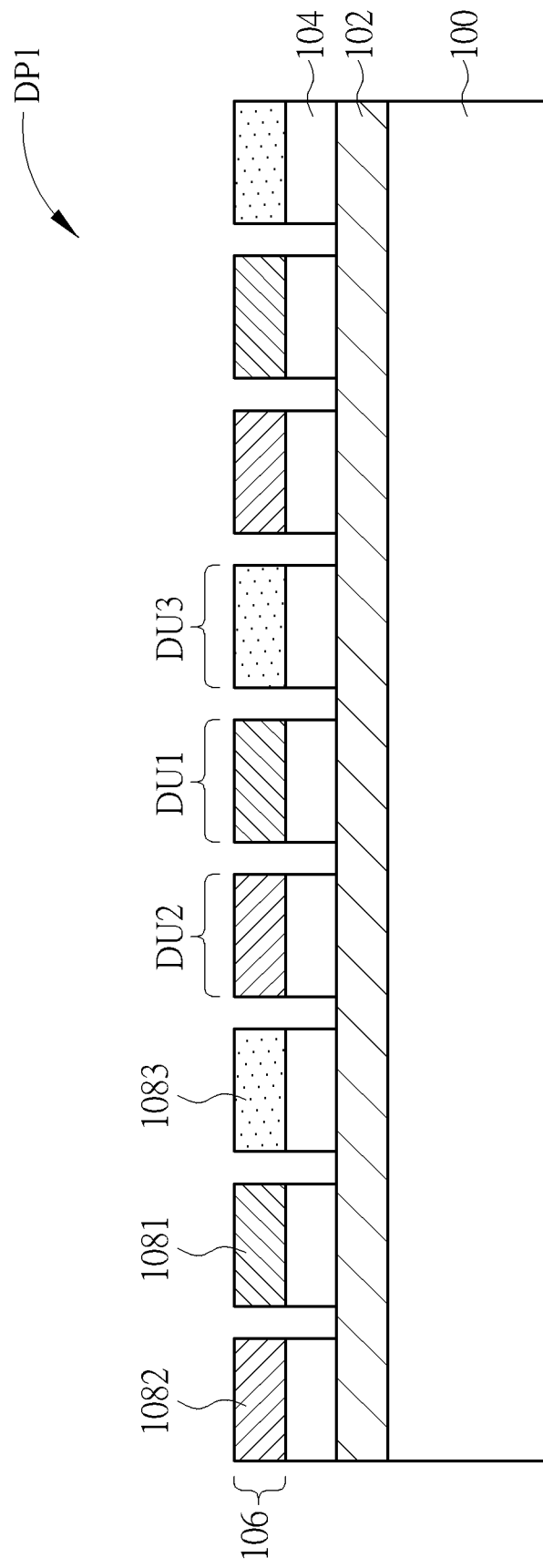
FIG. 1 is a schematic diagram of a cross-sectional view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them. In addition, when the component is referred to "be coupled to/with another component (or the variant thereof)", it may be directly connected to another component, or may be indirectly connected (such as electrically connected) to another component through other component or components.

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

When the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be noted that the technical features in different embodiments described in the following can be replaced, recombined, or mixed with one another to constitute another embodiment without departing from the spirit of the present disclosure.

In the disclosure, display units of a display device are sub-pixels or pixels for displaying image to the observer in all embodiments. Each display units is a stacking structure which comprises all related layers, elements or parts that are configured to emit light with brightness and color. For liquid crystal display device, the display units are sub-pixels, and each display unit may comprise related part of liquid crystal layer, related part of polarizer, related part of backlight, related substrate and driving circuit, and related color filter. For self-luminous display device (such as LED and OLED), the display units are sub-pixels or pixels, and each display unit may comprise related self-emitting source, related light conversion layer, related part of polarizer, and related substrate and driving circuit. In addition, several display units may have a common layer, a common element, or a common part.

In the disclosure, the output light is a final optical result from the display unit (or the display units) of the display device to the eyes of the observer (in all embodiments). The measurement of output spectrum of output light should be measured out of the display device and corresponding to a highest gray level (driving by an operation of the greatest gray level) of the display device.

Figure 2:
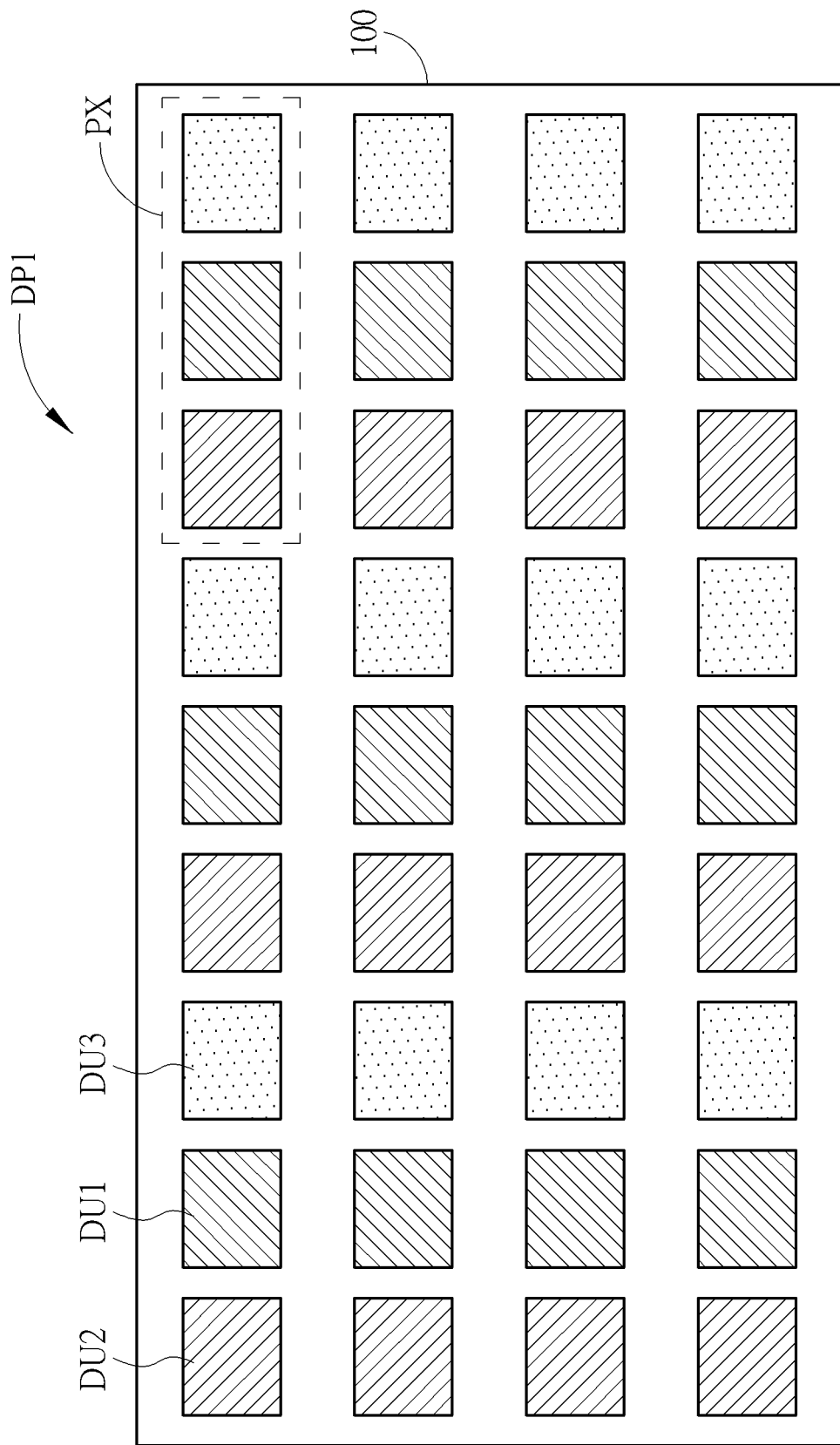
FIG. 2 is a schematic diagram of an arrangement of the display units of the pixels of the display device according to the first embodiment of the present disclosure.
Figure 3:
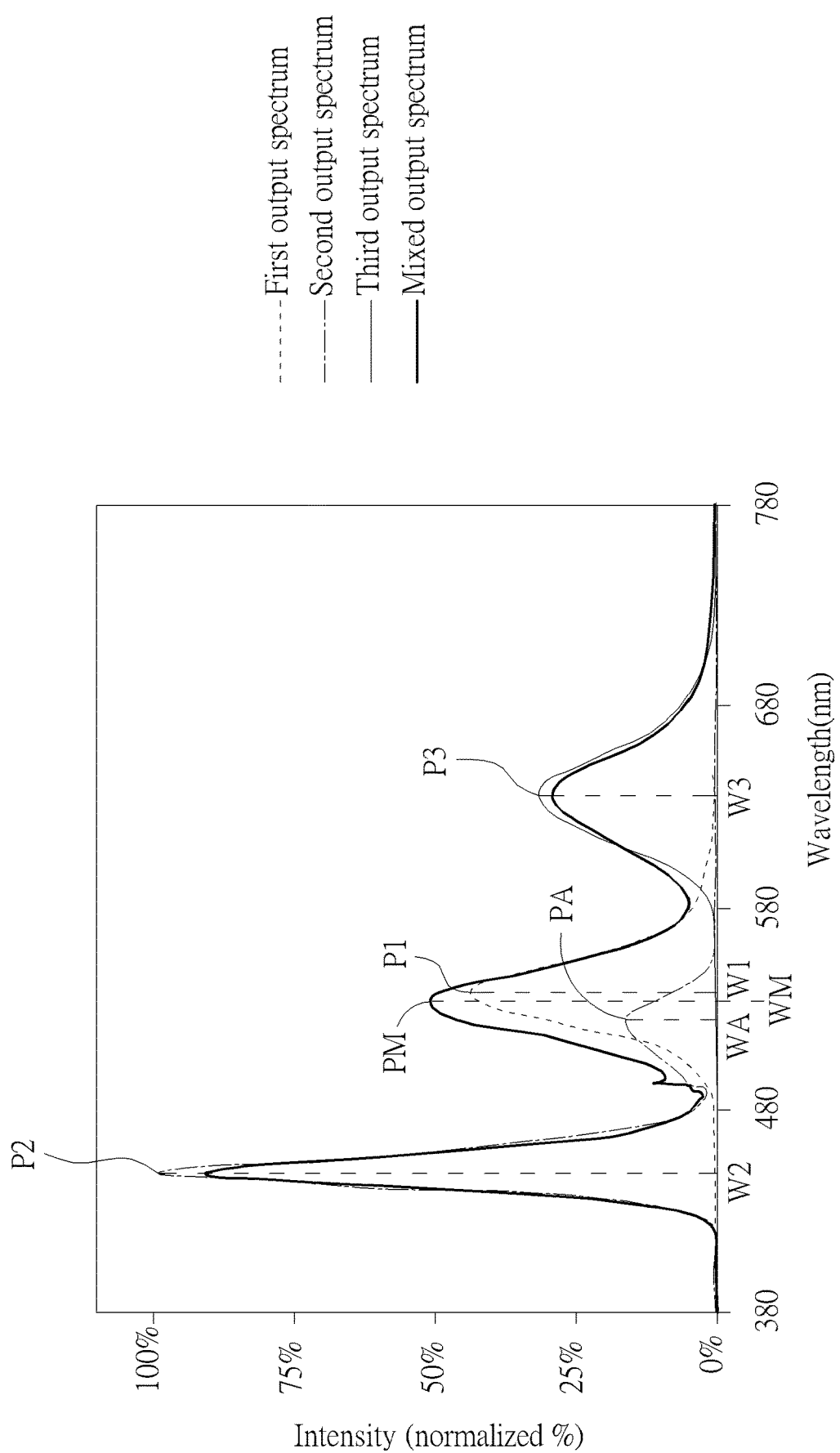
FIG. 3 is a schematic diagram of the respective output spectrums and mixed output spectrum of the display units of the display device according to the first embodiment of the present disclosure.

Referring to FIG. 1 to FIG. 3, FIG. 1 is a schematic diagram of a cross-sectional view of a display device according to a first embodiment of the present disclosure, FIG. 2 is a schematic diagram of an arrangement of display units of the display device according to the first embodiment of the present disclosure in top view, and FIG. 3 is a schematic diagram of the respective output spectrums and mixed output spectrum of the display units of the display device according to the first embodiment of the present disclosure. The display device DP1 of this embodiment includes at least one first display unit DU1 and at least one second display unit DU2 for emitting lights with non-identical spectrums, and the display device DP1 may selectively include at least one third display unit DU3 for emitting light with spectrum not identical to those of the first display unit DU1 and the second display unit DU2. In this embodiment, the display device DP1 includes a plurality of first display units DU1, a plurality of second display units DU2 and a plurality of third display units DU3 arranged side by side, as shown in FIG. 2. In addition, one of the first display units DU1, one of the second display units DU2 and one of the third display units DU3 form a pixel PX, and the first display unit DU1 is disposed between the second display unit DU2 and the third display unit DU3 in each pixel PX, but the arrangement of the display units is not limited thereto.

Each of the first display units DU1, the second display units DU2 and the third display units DU3 is composed of several elements respectively, and their structures are introduced below in detail. Physically, the display device DP1 includes a first substrate 100, a display circuit array 102 (including transistors, wirings, electrodes, or capacitors) for driving, a plurality of self-luminous light sources 104 and a light conversion layer 106. There are several elements and layers are not shown in FIG. 1, e.g., polarizer (or other optical film), encapsulation layer, or insulating layer. The first substrate 100 may be a hard substrate such as a glass substrate, a plastic substrate, a quartz substrate or a sapphire substrate, and/or may be a flexible substrate such as polyimide (PI) or polyethylene terephthalate (PET), but not limited thereto. The display circuit array 102 is disposed on the first substrate 100, the display circuit array 102 may include transistors (such as TFTs), gate lines, data lines, common lines, electrodes, capacitors, or other driving elements and parts, and the light sources 104 are disposed on the display circuit array 102 and electrically connected to related part of the circuits of the display circuit array 102. The display circuit array 102 is utilized for controlling the light sources 104 to emit light with corresponding gray level (or light intensity). The light sources 104 may be any type of light-emitting source, such as blue micro-sized (micrometer scale size) inorganic light-emitting diode (blue micro-LED), white micro-sized (micrometer scale size) inorganic light-emitting diode (white micro-LED) or organic light-emitting diodes (OLED), but not limit thereto. That is to say, the display device DP1 of this embodiment may be a self-luminous type display device such as a micro-LED display device. The light sources 104 of this embodiment are blue micro-OLEDs for example, which means the light sources 104 emit blue light and a main peak of the spectrum of the light emitted from the light sources 104 may be at about 450 nm of wavelength.

The light conversion layer 106 is disposed on the light sources 104 for converting or adjusting the spectrum or color of the light emitted from the light sources 104. The light conversion layer 106 for example may include a plurality of first conversion units 1081, a plurality of second conversion units 1082 and a plurality of third conversion units 1083, which may include quantum dot materials, color filter materials, phosphor materials, or combination of at least two of those materials. Each of the first conversion units 1081, the second conversion units 1082 and the third conversion units 1083 is corresponding to one of the light sources 104. In this embodiment, the first conversion units 1081 are used for converting the light (input light with input spectrum) emitted from the light sources 104 into the output light having a maximum peak of the spectrum corresponding to a wavelength for example ranging from 495 nm to 570 nm, or from 507 nm to 555 nm, which may be called as green light. In another aspect, the third conversion units 1083 are used for converting the light (input light with input spectrum) emitted from the light sources 104 into the output light having a maximum peak of the spectrum corresponding to a wavelength for example ranging from 620 nm to 750 nm, which may be called as red light. In addition, the second conversion units 1082 include a color adjusting material, such as pigment, quantum dot or color filter material, but not limited thereto, in order to modulate the blue light (input light with input spectrum) emitted from the light sources 104 to produce an output light with a spectrum having at least two waves. In this embodiment, the output spectrum of the output light from the second conversion units 1082 have two waves, one is the main wave and has the maximum peak corresponding to a wavelength of about 450 nm, and the other one is the sub wave corresponding to a wavelength ranging from 495 nm to 570 nm.

Accordingly, each first display unit DU1 is formed of one of the light sources 104, a portion of the display circuit array 102 electrically connected to the corresponding light source 104 and one of the first conversion units 1081 disposed on the corresponding light source 104; each second display unit DU2 is formed of one of the light sources 104, a portion of the display circuit array 102 electrically connected to the corresponding light source 104 and one of the second conversion units 1082 disposed on the corresponding light source 104; and each third display unit DU3 is formed of one of the light sources 104, a portion of the display circuit array 102 electrically connected to the corresponding light source 104 and one of the third conversion units 1083 disposed on the corresponding light source 104.

As shown in FIG. 1 and FIG. 3, the first display units DU1 respectively emit a first output light under an operation of the highest gray level (corresponding to a highest gray level of the display device), wherein the first output light has a first output spectrum; the second display units DU2 respectively emit a second output light under an operation of the highest gray level (corresponding to a highest gray level of the display device), wherein the second output light has a second output spectrum; and the third display units DU3 emit a third output light under an operation of the highest gray level (corresponding to a highest gray level of the display device), wherein the third output light has a third output spectrum. A maximum peak (local maximum intensity) of the first output spectrum from 507 nm to 555 nm is defined as a first peak P1 corresponding to a first wavelength W1, a maximum peak (local maximum intensity) of the second output spectrum is defined as a second peak P2 corresponding to a second wavelength W2, and a maximum peak (local maximum intensity) of the third output spectrum is defined as a third peak P3 corresponding to a third wavelength W3. As mentioned-above, since the first display units DU1 of this embodiment include the first conversion units 1081, the first wavelength W1 of the first peak P1 is in the wavelength range of green light. Similarly, the second wavelength W2 of the second peak P2 is in the wavelength range of blue light, and the third wavelength W3 of the third peak P3 is in the wavelength range of red light since the second display units DU2 and the third display unit DU3 respectively include the second conversion units 1082 and the third conversion units 1083. In particular, because each of the second conversion units 1082 of this embodiment includes the color adjusting material, the second output spectrum of the second output light have at least two waves and two corresponding peaks, one is the second peak P2 (corresponding to the second wavelength W2) of the main wave of the second output spectrum, and the other one is the peak of the sub wave of the second output spectrum, which is a maximum peak (local maximum intensity) of the second output spectrum from 494 nm to 580 nm and is defined as an adjusting peak PA corresponding to an adjusting wavelength WA. The adjusting wavelength WA may be in a wavelength range from 495 nm to 570 nm, which corresponds to green light. However, the adjusting wavelength WA is different from the first wavelength W1. In addition, as shown in FIG. 3, a mixed output spectrum is a mixture spectrum of the first output spectrum, the second output spectrum and the third output spectrum. The mixture spectrum could be seen as a spectrum of white light produced by the display device DP1 of this embodiment when the first display units DU1, the second display units DU2, and the third display units DU3 are under the operation of the highest gray level (corresponding to a highest gray level of the display device). A maximum peak (local maximum intensity) of the mixed output spectrum from 507 nm to 555 nm is defined as a mixed peak PM corresponding to a mixture wavelength WM, and the mixture wavelength WM corresponds to the wavelength range of green light. As shown in FIG. 3, a value of full width at half maximum (FWHM) corresponding to the first peak P1 (the maximum peak of the first output spectrum) is different from a value of FWHM corresponding to the second peak P2 (the maximum peak of the second output spectrum), and a wavelength corresponding to a maximum peak of the mixed output spectrum is equal to the second wavelength W2 corresponding to the second peak P2 (the maximum peak of the second output spectrum).

Regarding the human eyes, in the photopic vision, the most sensitive wavelength is about 555 nm; in the scotopic vision (dark vision), the most sensitive wavelength is about 507 nm; and in the mesopic vision (middle vision), the sensitive wavelength ranges from about 507 nm to about 555 nm, or ranges from about 521 nm to about 541 nm in some cases, and 531 nm may be the most sensitive wavelength of the mesopic vision. In addition, the wavelength of 531 nm is a middle (mean value) wavelength of 507 nm and 555 nm, and thus the wavelength of 531 nm±10 nm (from 521 nm to 541 nm) may be the most comfortable and sensitive wavelength range for the above-mentioned three kinds of visions. Generally, the conventional display device is designed for the photopic vision of the human eyes, and therefore the peak of the spectrum of green light of the conventional display device is close to the sensitive wavelength of 555 nm of photopic vision, which it is disadvantageous for the user to watch pictures or images with the scotopic vision or the mesopic vision. In the present disclosure, because the adjusting wavelength WA and the first wavelength W1 is in the wavelength range of green light, the mixed peak PM would be directly influenced by the adjusting peak PA and the first peak P1. Specifically, the mixed peak PM may be seen as a mixture of the adjusting peak PA and the first peak P1. Since the adjusting wavelength WA is different from the first wavelength W1, the mixture wavelength WM is located between the adjusting wavelength WA and the first wavelength W1, and thus, the mixture wavelength WM (the peak of the green segment of the outputted white light) will be shifted from the first wavelength W1 of green light toward the adjusting wavelength WA. In this embodiment shown in FIG. 3, for example, the first wavelength W1 of the first output spectrum of the first output light is greater than the sensitive wavelength of the mesopic vision, such as greater than 531 nm, and therefore, in order to meet the sensitive wavelength of the mesopic vision, the adjusting wavelength WA is designed to be less than the first wavelength W1, such that the mixture wavelength WM is greater than the adjusting wavelength WA and less than the first wavelength W1 and is shifted toward the sensitive wavelength of 531 nm of the mesopic vision. In other words, the mixture wavelength WM of the mixed output spectrum of at least the first output light of the first display unit DU1 and at least the second output light of the second display unit DU2 is closer to the sensitive wavelength of the mesopic vision compared to the first wavelength W1.

According to the present disclosure, the adjusting peak PA is particularly generated through the color adjusting material. Therefore, when the content or the composition of the color adjusting material is changed, the second output spectrum would be changed at the same time, such that the adjusting wavelength WA or the intensity of the adjusting peak PA would be changed, so as to adjust the mixed peak PM or the mixture wavelength WM. When the adjusting wavelength WA is more distant from the first wavelength W1 or the intensity of the adjusting peak PA is greater, a wavelength difference between the first wavelength W1 and the mixture wavelength WM is greater. In this embodiment, the wavelength difference between the first wavelength W1 and the mixture wavelength WM may range from about 1 nm to about 5 nm, about 1 nm to about 3 nm, or about 1 nm to about 2 nm, but not limited thereto. It should be noted that if the intensity of the adjusting peak PA is too great, the second output spectrum of the second output light would be influenced, affecting the color hue or the performance of the second output light, as well as the mixed output spectrum of the mixed output light. For example, in this embodiment, the second main wave with the second peak P2 of the second output light corresponds to the wavelength range of blue light, and the sub wave with the adjusting peak PA corresponds to the wavelength range of green light. Therefore, if the adjusting peak PA is too high or the total intensity integral of the sub wave of the second output light is to large, a serious color shift of the second output light would be generated, so as to influence the color hue of the white light emitted from the display device DP1 of this embodiment. Thus, according to the present disclosure, an intensity integral of the first output spectrum from 380 nm to 780 nm is defined as a first intensity integral, an intensity integral of the second output spectrum from 494 nm to 580 nm, which refers to the sub wave of the second output spectrum, is defined as a second intensity integral, a ratio of the second intensity integral to the first intensity integral is defined as a first ratio, and the first ratio may be greater than 0% and less than or equal to 26.0%, as shown in table 1. According to samples 1-5, when the first ratio is about 26.0%, the wavelength difference between the first wavelength W1 (when the first ratio is 0.0%) and the mixture wavelength WM may range from about 3 nm to about 5 nm.

TABLE 1

The first ratio of samples 1-5 according to the mixture wavelength WM

| | Mixture wavelength (nm) | | | | | | | | | |
|---|---|---|---|---|---|---|---|---|---|---|
| | 531 | 532 | 533 | 534 | 535 | 536 | 537 | 538 | 539 | 540 |
| First ratio of sample 1 (%) | 38.3 | 30.1 | 21.9 | 10.9 | 6.6 | 1.6 | 0.0 | — | — | — |
| First ratio of sample 2 (%) | 35.3 | 25.9 | 16.5 | 8.8 | 0.0 | — | — | — | — | — |
| First ratio of sample 3 (%) | 54.5 | 46.8 | 39.1 | 27.3 | 22.7 | 19.5 | 16.4 | 7.3 | 2.3 | 0.0 |
| First ratio of sample 4 (%) | 48.3 | 36.2 | 30.2 | 21.7 | 12.1 | 7.2 | 0.0 | — | — | — |
| First ratio of sample 5 (%) | 57.3 | 40.1 | 32.1 | 22.9 | 13.8 | 9.2 | 0.0 | — | — | — |

Furthermore, an intensity integral of the third output spectrum from 380 nm to 780 nm is defined as a third intensity integral, and a ratio of the second intensity integral to the third intensity integral is defined as a second ratio. According to the present disclosure, the second ratio may be greater than 0% and less than or equal to 28.0%, as shown in table 2. Referring to samples 1-5, when the second ratio is about 28.0%, the wavelength difference between the wavelength W1 (when the second ratio is 0.0%) and the mixture wavelength WM may range from about 3 nm to about 5 nm.

TABLE 2

The second ratio of samples 1-5 according to the mixture wavelength WM

| | Mixture wavelength (nm) | | | | | | | | | |
|---|---|---|---|---|---|---|---|---|---|---|
| | 531 | 532 | 533 | 534 | 535 | 536 | 537 | 538 | 539 | 540 |
| Second ratio of sample 1 (%) | 44.6 | 35.0 | 25.5 | 12.7 | 7.6 | 1.9 | 0.0 | — | — | — |
| Second ratio of sample 2 (%) | 38.1 | 28.0 | 17.9 | 9.5 | 0.0 | — | — | — | — | — |
| Second ratio of sample 3 (%) | 63.3 | 54.3 | 45.3 | 31.6 | 26.4 | 22.7 | 19.0 | 8.4 | 2.6 | 0.0 |
| Second ratio of sample 4 (%) | 52.3 | 39.2 | 32.7 | 23.5 | 13.1 | 7.8 | 0.0 | — | — | — |
| Second ratio of sample 5 (%) | 69.2 | 48.5 | 38.8 | 27.7 | 16.6 | 11.1 | 0.0 | — | — | — |

Accordingly, the light emitted from the display device DP1 of this embodiment would meet the sensitive wavelength of the mesopic vision due to the aforementioned design, and therefore the display device DP1 of this embodiment is suitable for being applied to an electronic device of which the environmental illumination condition or luminance viewing condition may be changeable. For example, the display device DP1 may be used as an automotive display or an aviation display. In this case, even though the luminance viewing condition is changed from a high luminance viewing condition into a low luminance viewing condition when the car moves from an outdoor into a tunnel in the daytime, the user could still watch the automotive display with high viewing quality because the display device DP1 provides an adjusted spectrum of output light closer to the sensitive wavelength of mesopic vision. As a result, the safety of driving would be improved.

The display device is not limited to the aforementioned embodiment, and may have other different variant embodiments or embodiments. To simplify the description, the identical components in the following variant embodiments or embodiments are marked with identical symbols. For making it easier to compare the difference between the embodiments or variant embodiments, the following description will detail the dissimilarities among different embodiments or variant embodiments and the identical features will not be redundantly described.

Figure 4:
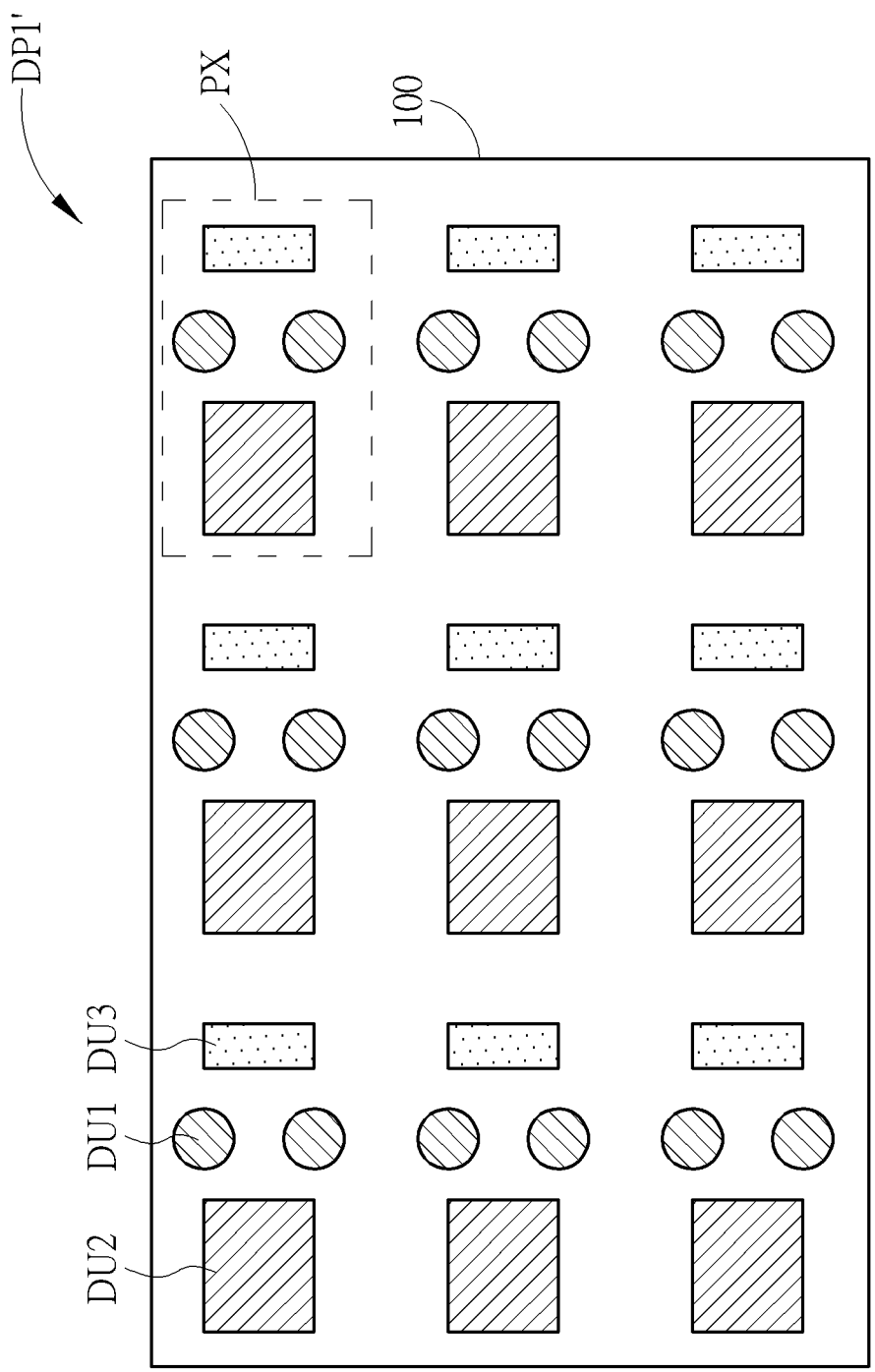
FIG. 4 is a schematic diagram of an arrangement of the display units of a display device according to a variant embodiment of the first embodiment of the present disclosure.

Referring to FIG. 4, FIG. 4 is a schematic diagram of an arrangement of the display units of a display device according to a variant embodiment of the first embodiment of the present disclosure. As shown in FIG. 4, the arrangement of the first display units DU1, the second display units DU2 and the third display units DU3 of the display device DP1' of this variant embodiment is different from the arrangement of the first embodiment. In this variant embodiment, two of the first display units DU1, one of the second display units DU2 and one of the third display units DU3 form a pixel PX, and two first display units DU1 are disposed between the second display unit DU2 and the third display unit DU3 in one of the pixels PX. Moreover, a size of the first display units DU1 and a size of the second display units DU2 may be different. Selectively, a size of the third display units DU3 may be different from those of the second display units DU2 and the first display units DU1. In this variant embodiment, the size of the first display units DU1 is smaller than the size of the third display units DU3, and the size of the third display units DU3 is smaller than the size of the second display units DU2, but not limited thereto. In addition, the light-emitting shapes or the light-emitting areas of the first display units DU1, the second display units DU2 and the third display units DU3 may be non-identical. For example, the light-emitting shapes of the first display units DU1 are circular, the light-emitting shapes of the second display units DU2 are rectangular, and the light-emitting shapes of third display units DU3 are stripe-shaped in this variant embodiment, but not limited thereto.

Figure 5:
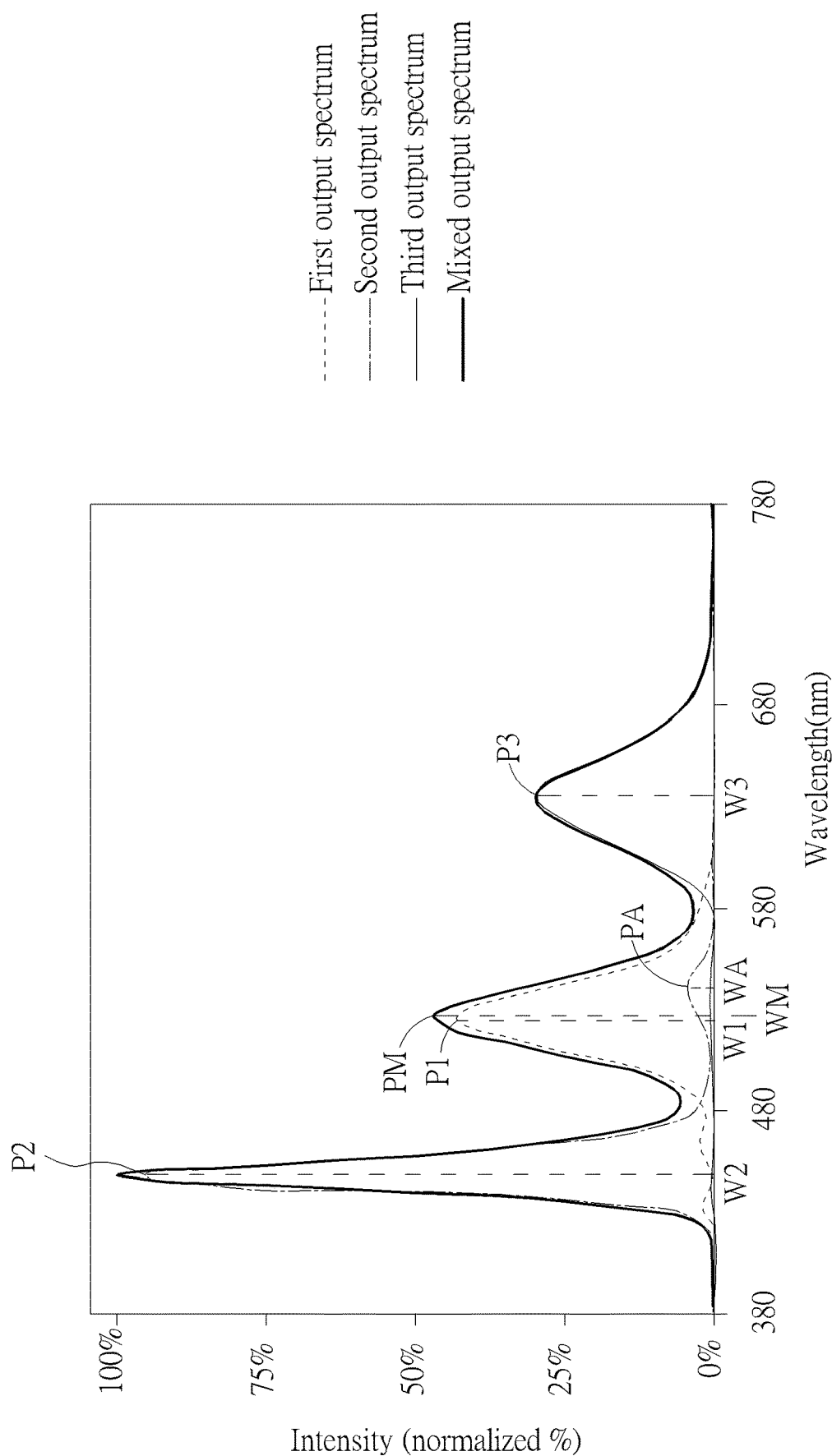
FIG. 5 is a schematic diagram of the respective output spectrums and mixed output spectrum of the display units of a display device according to a second embodiment of the present disclosure.

Referring to FIG. 5, FIG. 5 is a schematic diagram of the respective output spectrums and mixed output spectrum of the display units of a display device according to a second embodiment of the present disclosure. As shown in FIG. 5, the difference between this embodiment and the first embodiment is that the first wavelength W1 is less than the sensitive wavelength of the mesopic vision, such as being less than 531 nm. Therefore, in order to meet the sensitive wavelength of the mesopic vision, the adjusting wavelength WA is designed for being greater than the first wavelength W1 and even greater than 531 nm through changing the content or the composition of the color adjusting material for instance. Accordingly, the mixture wavelength WM is greater than the first wavelength W1 and close to the sensitive wavelength of the mesopic vision compared to the first wavelength W1. Different from the first embodiment, the adjusting peak PA corresponding to the adjusting wavelength WA may be in the wavelength range from 511 nm to 597 nm in this embodiment.

As mentioned above, the peak of the sub wave of the second output spectrum is defined as the adjusting peak PA, and when the intensity of the adjusting peak PA is too high or the intensity integral of the sub wave of the second output spectrum is too great, the color hue or color performance of the second output light would be influenced. Thus, in this embodiment, an intensity integral of the second output spectrum from 511 nm to 597 nm is defined as a fourth intensity integral, and a ratio of the fourth intensity integral to the above-defined first intensity integral is defined as a third ratio, wherein the third ratio may be greater than 0% and less than or equal to 25.0%, as shown in table 3. Furthermore, a ratio of the fourth intensity integral to the above-defined third intensity integral is defined as a fourth ratio, and the fourth ratio may be greater than 0% and less than or equal to 29.0%, as shown in table 4. According to samples 6-10 in Table 3, when the third ratio is about 25.0%, the wavelength difference between the first wavelength W1 and the mixture wavelength WM may range from about 2 nm to about 4 nm. In another aspect, according to samples 6-10 in Table 4, when the fourth ratio is 29.0%, the wavelength difference between the first wavelength W1 and the mixture wavelength WM may range from about 2 nm to about 4 nm. It is worth to note that the wavelength difference between the second wavelength W2 and the adjusting wavelength WA of this embodiment is greater than the wavelength difference between the second wavelength W2 and the adjusting wavelength WA of the first embodiment, thus the influence of the adjusting peak PA for the second output light is greater in this embodiment. For the same reason, the third ratio of this embodiment is mostly greater than the first ratio of the first embodiment when the wavelength difference between the first wavelength W1 and the mixture wavelength WM has the same value, and the fourth ratio of this embodiment is mostly greater than the second ratio of the first embodiment when the wavelength difference between the third wavelength W3 and the mixture wavelength WM has substantially the same value. Therefore, the wavelength difference between the first wavelength W1 and the mixture wavelength WM of this embodiment may be smaller than the first embodiment, so as to prevent the color hue of the white light emitted from the display device of this embodiment from being affected seriously.

TABLE 3

The third ratio of samples 6-10 according to the mixture wavelength WM

| | Mixture wavelength (nm) | | | | | | | |
|---|---|---|---|---|---|---|---|---|
| | 523 | 524 | 525 | 526 | 527 | 528 | 529 | 530 |
| Third ratio of sample 6 (%) | — | — | 0.0 | 14.2 | 20.8 | 27.3 | 41.0 | 54.7 |
| Third ratio of sample 7 (%) | 0.0 | 5.5 | 11.0 | 22.0 | 27.5 | 33.0 | 49.6 | 55.1 |
| Third ratio of sample 8 | — | — | — | — | 0.0 | 18.2 | 25.0 | 36.3 |

TABLE 3-continued

The third ratio of samples 6-10 according to the mixture wavelength WM

| | Mixture wavelength (nm) | | | | | | | |
|---|---|---|---|---|---|---|---|---|
| | 523 | 524 | 525 | 526 | 527 | 528 | 529 | 530 |
| Third ratio of sample 9 (%) | — | — | 0.0 | 12.1 | 18.1 | 21.1 | 24.1 | 36.2 |
| Third ratio of sample 10 (%) | — | — | 0.0 | 11.5 | 17.2 | 22.9 | 34.4 | 45.9 |

TABLE 4

The fourth ratio of samples 6-10 according to the mixture wavelength WM

| | Mixture wavelength (nm) | | | | | | | |
|---|---|---|---|---|---|---|---|---|
| | 523 | 524 | 525 | 526 | 527 | 528 | 529 | 530 |
| Fourth ratio of sample 6 (%) | — | — | 0.0 | 16.6 | 24.2 | 31.8 | 47.7 | 63.7 |
| Fourth ratio of sample 7 (%) | 0.0 | 6.0 | 11.9 | 23.8 | 29.8 | 35.8 | 53.6 | 59.6 |
| Fourth ratio of sample 8 (%) | — | — | — | — | 0.0 | 21.1 | 29.0 | 42.2 |
| Fourth ratio of sample 9 (%) | — | — | 0.0 | 13.1 | 19.6 | 22.9 | 26.2 | 39.2 |
| Fourth ratio of sample 10 (%) | — | — | 0.0 | 13.8 | 20.8 | 27.7 | 41.5 | 55.4 |

Figure 6:
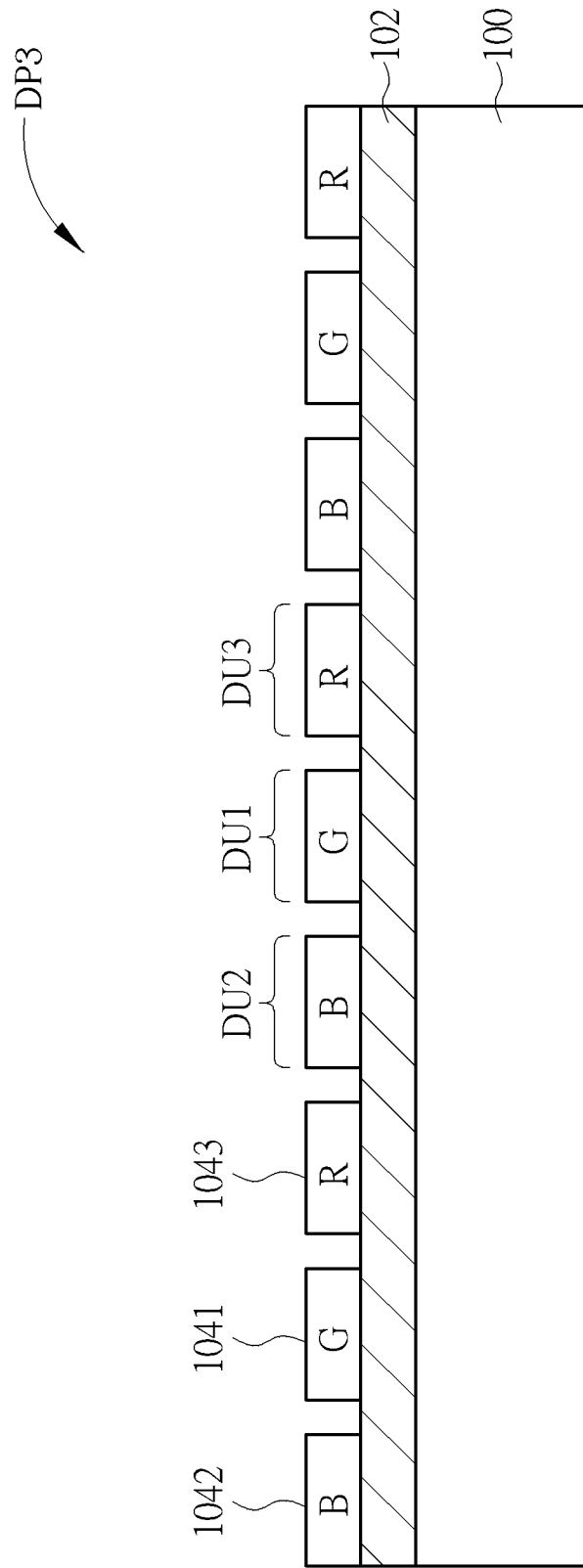
FIG. 6 is a schematic diagram of a cross-sectional view of a display device according to a third embodiment of the present disclosure.

Referring to FIG. 6, FIG. 6 is a schematic diagram of a cross-sectional view of a display device according to a third embodiment of the present disclosure. As shown in FIG. 6, the difference between this embodiment and the first embodiment is that the display device DP3 of this embodiment is a self-luminous display device, and the light sources of the display device DP3 include a plurality of first light sources 1041, a plurality of second light sources 1042 and a plurality of third light sources 1043. The first light sources 1041, the second light sources 1042 and the third light sources 1043 respectively emit light with different spectrum, which means the three kinds of light sources respectively emit different color lights. For example, the first light sources 1041 emit light having a spectrum with a main wave corresponding to the wavelength range from 495 nm to 570 nm, which is green light; the second light sources 1042 emit light having a spectrum with a main wave corresponding to the wavelength range from 430 nm to 475 nm, which is blue light; and the third light sources 1043 emit light having a spectrum with a main wave corresponding to a wavelength ranging from 620 nm to 750 nm, which is red light, but not limited thereto. Accordingly, the first light sources 1041, the second light sources 1042 and the third light sources 1043 are respectively symbolized by G, B R in FIG. 6 for identification. In this embodiment, the light sources 104 may be organic light-emitting diodes (OLED), micro-sized inorganic light-emitting diode (micro-LED) or quantum dot light-emitting diodes (QDLED), but not limited thereto. Furthermore, in this embodiment, each of the first display units DU1 includes one of the first light sources 1041 and a related portion of the display circuit array 102 electrically connected to the corresponding first light source 1041, each of the second display units DU2 includes one of the second light sources 1042 and a related portion of the display circuit array 102 electrically connected to the corresponding second light source 1042, and each of the third display units DU3 include one of the third light sources 1043 and a related portion of the display circuit array 102 electrically connected to the corresponding third light source 1043. Moreover, in this embodiment, each of the second light sources 1042 includes the color adjusting material, and the color adjusting material makes the second output spectrum of the second output light have at least two peaks, wherein at least one sub peak of the second output spectrum may be generated by the color adjusting material, which results in the wavelength difference between the mixed peak (with the mixture wavelength MW) of the mixed output spectrum of the display device DP3 and the first peak with the first wavelength W1 of the first output spectrum, as mentioned in the aforementioned embodiments. The relations between the output spectrums with the maximum peaks or the adjusting peak and wavelength differences of this embodiment, as well as the other embodiments introduced in the following, may be similar to the first embodiment or the second embodiment, and will not be redundantly described. A display unit of the display device may further include a related portion of other elements or layers, such as a related portion of substrate, a related portion of polarizer, a related portion of insulating layer, or a related portion of encapsulation layer. The shift effect of each ratio and color hue (x-coordinate value, y-coordinate value) by those elements and layers may be ignorable, and the dominant effective factor includes the light source and the color adjusting material. The output light could be regarded as the final visual light of the display device to the observer, and the output spectrum of output light is measured out of the display device.

Figure 7:
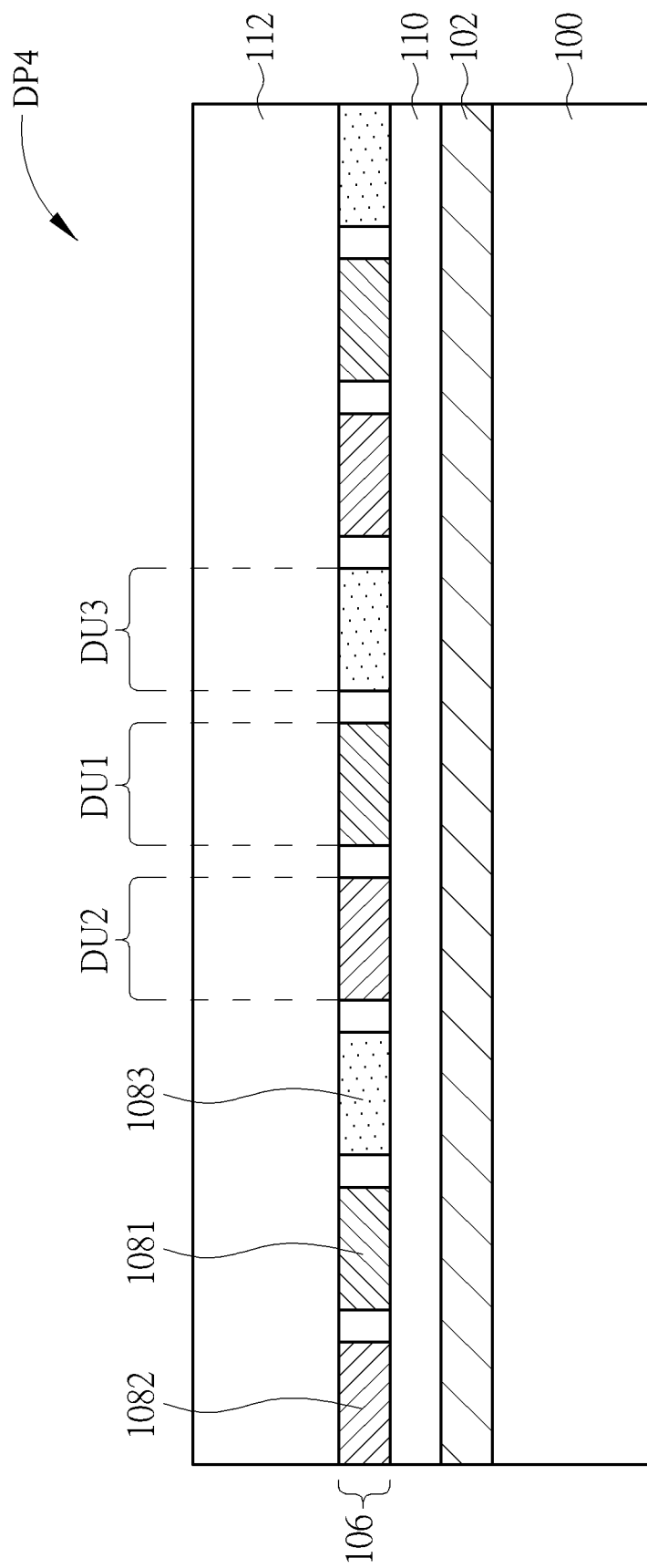
FIG. 7 is a schematic diagram of a cross-sectional view of a display device according to a fourth embodiment of the present disclosure.

Referring to FIG. 7, FIG. 7 is a schematic diagram of a cross-sectional view of a display device according to a fourth embodiment of the present disclosure. As shown in FIG. 7, the difference between this embodiment and the first embodiment is that the display device DP4 of this embodiment further includes a second substrate 112 and a light emitting layer 110. The light emitting layer 110 is disposed on the first substrate 100 and electrically connected to the display circuit array 102, and the light emitting layer 110 may include a plurality of light sources. For example, the light emitting layer 110 includes a plurality of blue OLEDs as the light sources. The second substrate 112 is disposed opposite to the first substrate 100. The second substrate 112 may be a hard substrate such as a glass substrate, a plastic substrate, a quartz substrate or a sapphire substrate, and/or may be a flexible substrate including such as polyimide (PI) or polyethylene terephthalate (PET), but not limited thereto. In addition, the light conversion layer 106 may be disposed on the second substrate 112. In this embodiment, the light conversion layer 106 is disposed between the second substrate 112 and the light emitting layer 110, but not limit thereto, and the second substrate 112 may be disposed between the light conversion layer 106 and the light emitting layer 110 in another variant embodiment. Furthermore, in this embodiment, each of the first display units DU1 includes a portion of the light emitting layer 110, a portion of the display circuit array 102 and one of the first conversion units 1081, each of the second display units DU2 includes a portion of the light emitting layer 110, a portion of the display circuit array 102 and one of the second conversion units 1082, and each of the third display units DU3 includes a portion of the light emitting layer 110, a portion of the display circuit array 102 and one of the third conversion units 1083. A display unit of the display device may further include a related portion of other elements or layers, such as a related portion of substrate, a related portion of polarizer, a related portion of insulating layer, or a related portion of encapsulation layer. The shift effect of each ratio and color hue (x-coordinate value, y-coordinate value) by those elements and layers may be ignorable, and the dominant effective factor includes the light emitting unit and the light converting layer. The output light could be regarded as the final visual light of the display device to the observer, and the output spectrum of output light is measured out of the display device.

Figure 8:
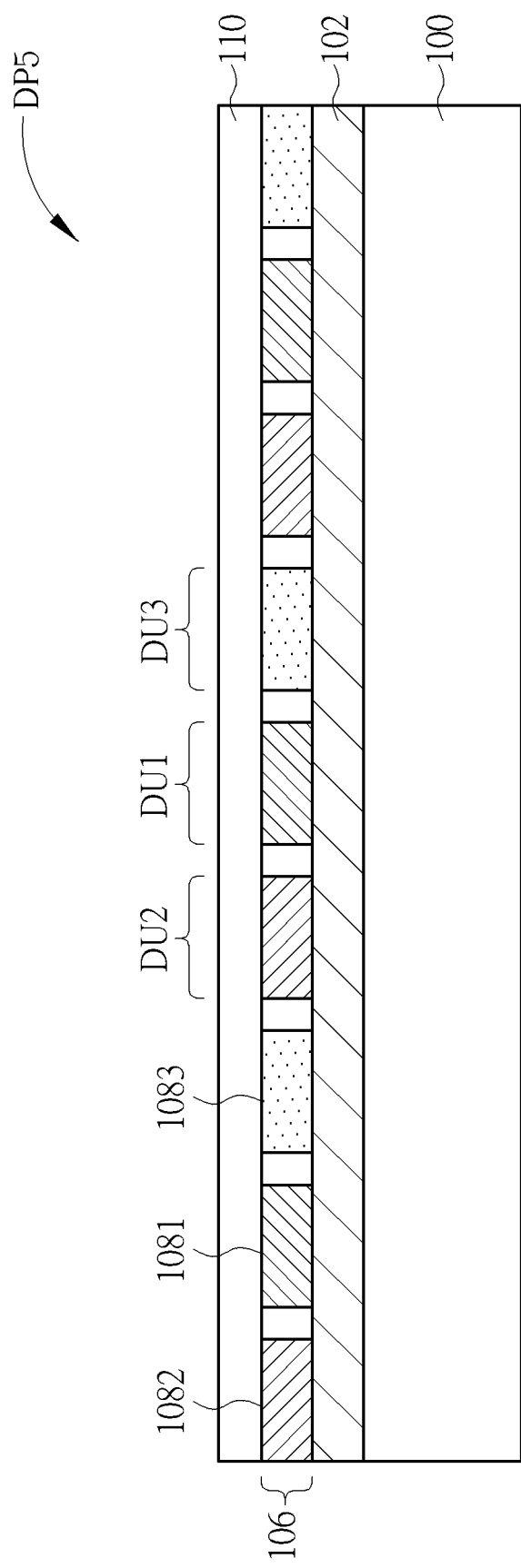
FIG. 8 is a schematic diagram of a cross-sectional view of a display device according to a fifth embodiment of the present disclosure.

Referring to FIG. 8, FIG. 8 is a schematic diagram of a cross-sectional view of a display device according to a fifth embodiment of the present disclosure. As shown in FIG. 8, the difference between this embodiment and the first embodiment is that the display device DP5 of this embodiment further includes a light emitting layer 110 to replace the light sources 104 shown in FIG. 1. The light emitting layer 110 is disposed on the first substrate 100 and electrically connected to the display circuit array 102, and the light emitting layer 110 may include a plurality of light sources, such as white OLEDs. The design of the display units are the same as the fourth embodiment, and will not be redundantly described. Moreover, another difference between this embodiment and the first embodiment is that the light conversion layer 106 is disposed between the light emitting layer 110 and the first substrate 100, and the light emitted from the light emitting layer 110 would pass through the light conversion layer 106, the display circuit array 102 and the first substrate 100 in sequence. Accordingly, the lower side of the first substrate 100 shown in FIG. 8 is the display side of the display device DP5.

Figure 9:
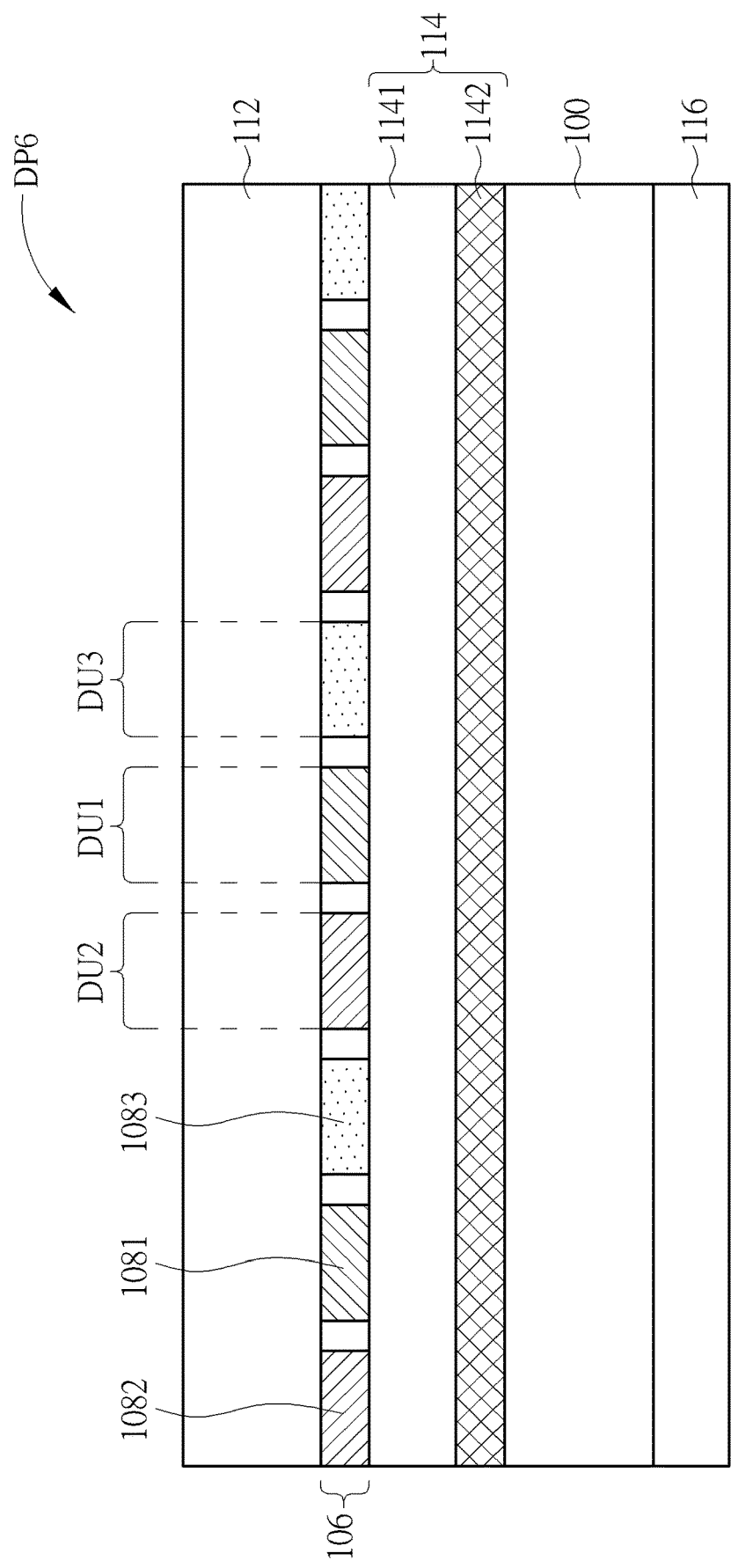
FIG. 9 is a schematic diagram of a cross-sectional view of a display device according to a sixth embodiment of the present disclosure.

Referring to FIG. 9, FIG. 9 is a schematic diagram of a cross-sectional view of a display device according to a sixth embodiment of the present disclosure. As shown in FIG. 9, the main difference between this embodiment and the first embodiment is that the display device DP6 of this embodiment is a non-self-luminous type display device. In this embodiment, the display device DP6 is a liquid crystal display device for example, which includes the first substrate 100, the second substrate 112, a light modulating layer 114, a backlight module 116 and at least one light conversion layer 106. The second substrate 112 is disposed opposite to the first substrate 100. The material of the first substrate 100 and the second substrate 112 are the same as the first embodiment and the fifth embodiment, and will not be redundantly described. The backlight module 116 is disposed adjacent to the first substrate 100, and the first substrate 100 is disposed between the backlight module 116 and the second substrate 112. The second substrate 112 is closer to the observer than the first substrate 100. The backlight module 116 is utilized for emitting white light. For example, the backlight module 116 may include at least one white light source, or may include three types of light sources 104 emitting different color lights (such as red light, green light and blue light) to compose the white light. The light modulating layer 114 is disposed on the first substrate 100 and disposed between the first substrate 100 and the second substrate 112, and the light modulating layer 114 is utilized for controlling the gray level (or the light intensity) of the light. In this embodiment, the light modulating layer 114 may include a display component layer 1142 and a display medium layer 1141. The display component layer 1142 is disposed between the first substrate 100 and the display medium layer 1141 for controlling the transparence of the display medium layer 1141 so as to determine the gray level of corresponding sub-pixels. The display medium layer 1141 is disposed between the display component layer 1142 and the light conversion layer 106. Since the display device DP6 of this embodiment is a liquid crystal display device, the display medium layer 1141 includes a plurality of liquid crystal molecules, but not limited thereto.

The light conversion layer 106 is disposed between the second substrate 112 and the light modulating layer 114, and may include first conversion units 1081, second conversion units 1082 and third conversion units 1083, wherein these conversion units may have color filter materials and/or quantum dot materials. In this embodiment, each of the first display units DU1 includes a portion of the backlight module 116, a portion of the light modulating layer 114 and one of the first conversion units 1081, each of the second display units DU2 includes a portion of the backlight module 116, a portion of the light modulating layer 114 and one of the second conversion units 1082, and each of the third display units DU3 includes a portion of the backlight module 116, a portion of the light modulating layer 114 and one of the third conversion units 1083. It should be noted that the second conversion units 1082 may include color adjusting material for making the second output spectrum of the second display units DU2 have at least two waves, wherein the sub wave have the adjusting peak PA mentioned above. A display unit of the display device may further include a related portion of other elements or layers, such as a related portion of substrate, a related portion of polarizer, a related portion of insulating layer, or a related portion of encapsulation layer. The shift effect of each ratio and color hue (x-coordinate value, y-coordinate value) by those elements and layers may be ignorable, and the dominant effective factor includes the backlight module and the light converting units. The output light could be regarded as the final visual light of the display device to the observer, and the output spectrum of output light is measured out of the display device.

Figure 10:
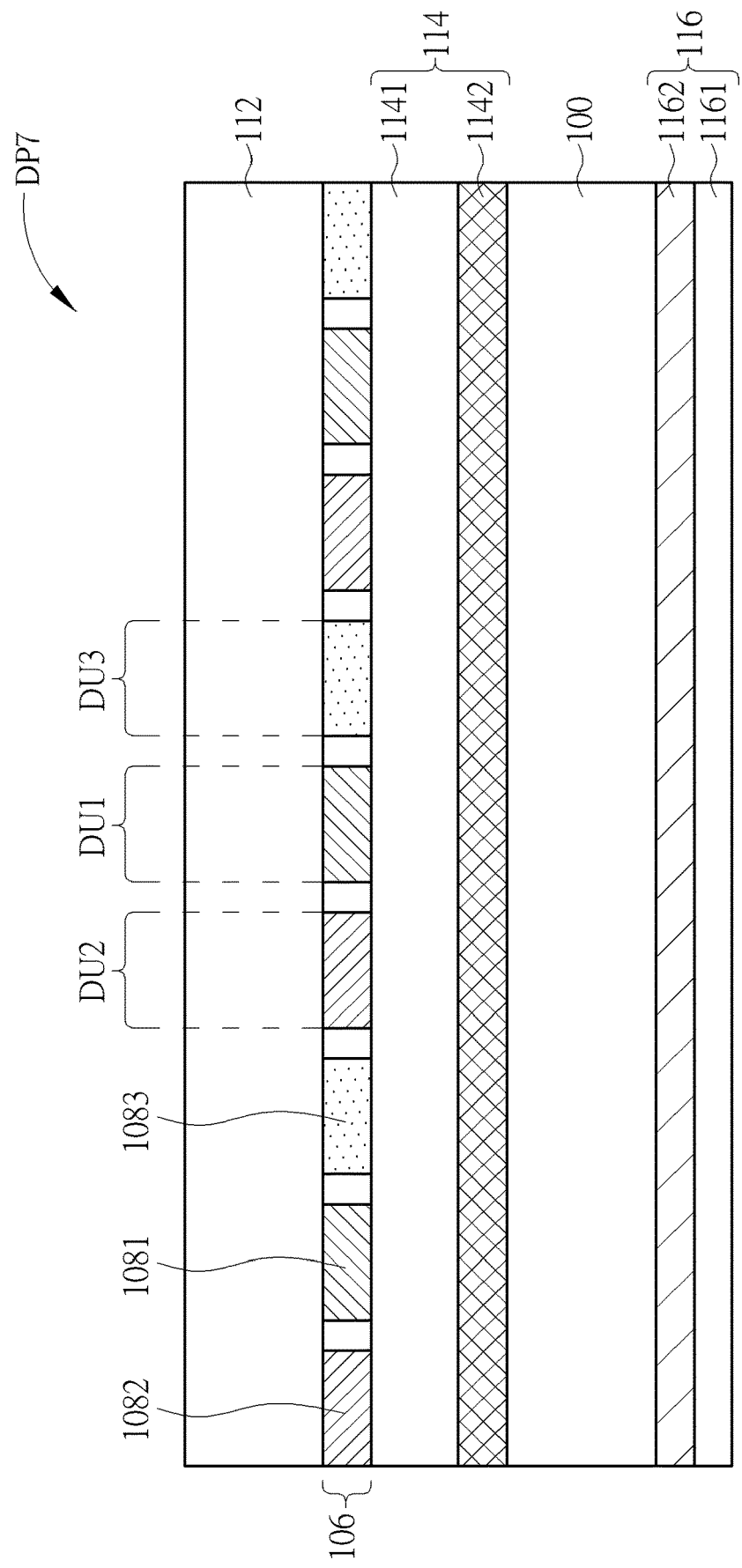
FIG. 10 is a schematic diagram of a cross-sectional view of a display device according to a seventh embodiment of the present disclosure.

Referring to FIG. 10, FIG. 10 is a schematic diagram of a cross-sectional view of a display device according to a seventh embodiment of the present disclosure. The difference between this embodiment and the sixth embodiment is the backlight module 116 of the display device DP7 includes a backlight unit 1161 and a light conversion film 1162. In this embodiment, the backlight unit 1161 emits blue light or light with small wavelength, and the light conversion film 1162 include quantum dot materials that can convert the light emitted from the backlight unit 1161 into white light. Therefore, the light produced by the backlight module 116 is white light, similar to the sixth embodiment.

Figure 11:
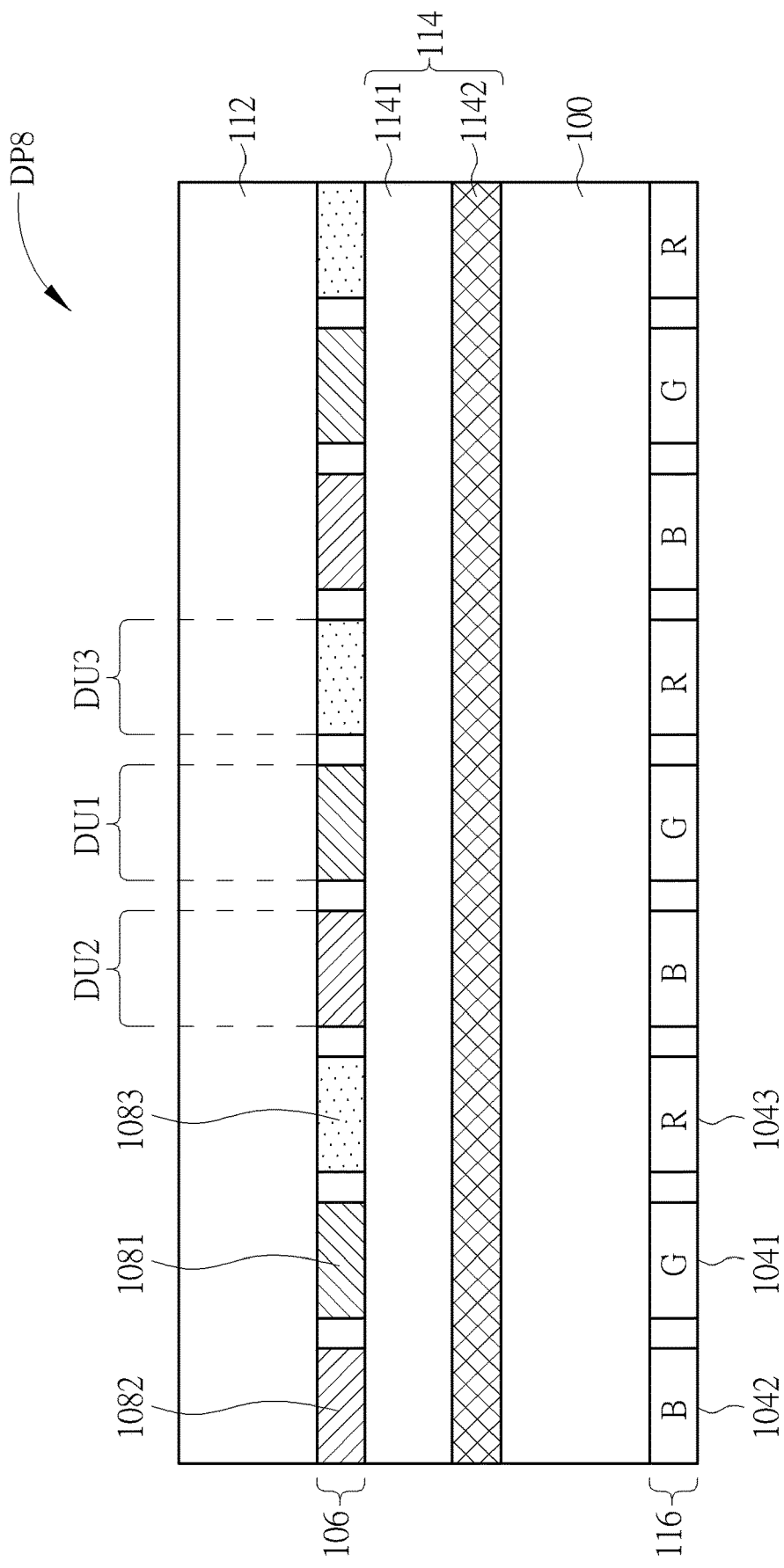
FIG. 11 is a schematic diagram of a cross-sectional view of a display device according to an eighth embodiment of the present disclosure.

Referring to FIG. 11, FIG. 11 is a schematic diagram of a cross-sectional view of a display device according to an eighth embodiment of the present disclosure. The difference between this embodiment and the sixth embodiment is that the backlight module 116 of the display device DP8 of this embodiment includes a plurality first light sources 1041, a plurality of second light sources 1042 and a plurality of third light source 1043 for emitting different light, as mentioned in the third embodiment. These light sources may include LEDs or micro-LEDs for instance. In this embodiment, each of the first display units DU1 includes one of the first light sources 1041, a portion of the light modulating layer 114 and one of the first conversion units 1081, each of the second display units DU2 includes one of the second light sources 1042, a portion of the light modulating layer 114 and one of the second conversion units 1082, and each of the third display units DU3 includes one of the third light sources 1043, a portion of the light modulating layer 114 and one of the third conversion units 1083.

Figure 12:
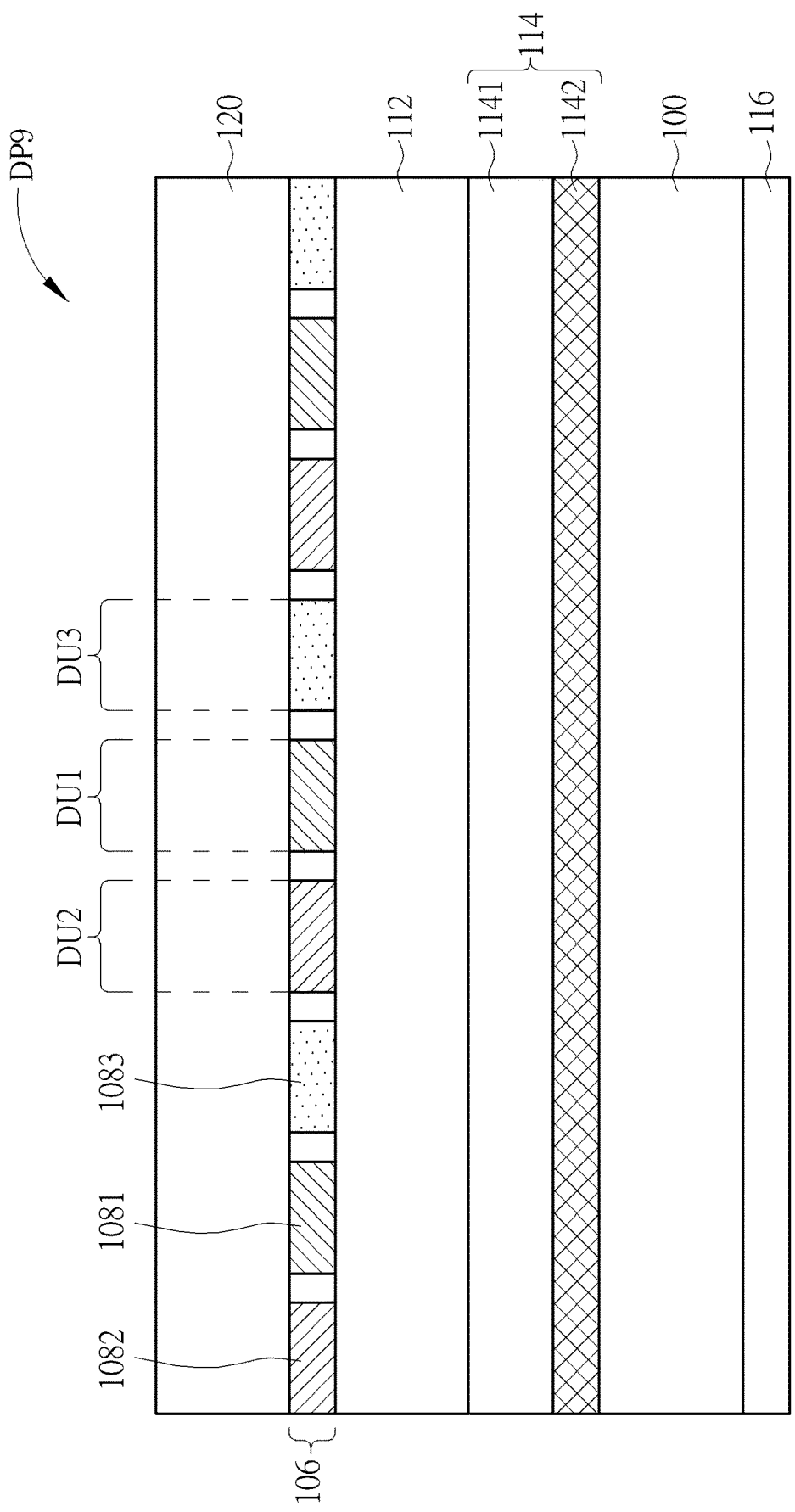
FIG. 12 is a schematic diagram of a cross-sectional view of a display device according to a ninth embodiment of the present disclosure.

Referring to FIG. 12, FIG. 12 is a schematic diagram of a cross-sectional view of a display device according to a ninth embodiment of the present disclosure. The difference between this embodiment and the sixth embodiment is that the display device DP9 of this embodiment includes that the light conversion layer 106 is disposed on a surface of the second substrate 112 opposite to the light modulating layer 114, and further, the display device DP9 includes a third substrate 120. As shown in FIG. 12, the second substrate 112 is situated between the first substrate 100 and the third substrate 120, and the light conversion layer 106 is disposed between the second substrate 112 and the third substrate 120. The third substrate 120 may be a hard substrate such as a glass substrate, a plastic substrate, a quartz substrate or a sapphire substrate, and/or may be a flexible substrate including such as polyimide (PI) or polyethylene terephthalate (PET), but not limited thereto. The light conversion layer 106 may include the quantum dots or the color filters according to the color of the light emitted from the backlight module 116. When the backlight module 116 emits white light, the first conversion units 1081, the second conversion units 1082 and the third conversion units 1083 could respectively conversing the white light into green light, blue light and red light for example. When the backlight module 116 emits blue light, the first conversion units 1081 and the third conversion units 1083 could respectively conversing the blue light into green light and red light. Similar to the above-mentioned embodiments, the second conversion units 1082 may include color adjusting materials, such as pigment or quantum dot, to make the output light of the second conversion units 1082 have two waves in the spectrum.

To summarize, in the display device of the present disclosure, since the mixed peak of the mixed output spectrum would be directly influenced by the adjusting peak and the first peak, the mixture wavelength can be shifted according to the adjusting wavelength or the intensity of the adjusting peak, so as to close to the sensitive wavelength of the mesopic vision. Therefore, the light emitted from the display device of the present disclosure would meet the sensitive wavelength of the mesopic vision due to the aforementioned design. When the display device of the present disclosure is applied to an electronic device which may be used in changeable environment, the user could view the displayed images clearer and more comfortable no matter in low luminance viewing condition, in high luminance viewing condition, or in a transition luminance viewing condition if the environment is changed. Besides, the users can view the displayed images with high viewing quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a first display unit emitting a green light having a first output spectrum corresponding to a highest gray level of the display device; and
    a second display unit emitting a blue light having a second output spectrum corresponding to the highest gray level of the display device,
    wherein an intensity integral of the first output spectrum within a range from 380 nm to 780 nm is defined as a first intensity integral, an intensity integral of the second output spectrum within a range from 511 nm to 597 nm is defined as a second intensity integral, a ratio of the second intensity integral to the first intensity integral is defined as a first ratio, and the first ratio is greater than 0% and less than or equal to 25.0%.

2. The display device of claim 1, wherein the first ratio is greater than or equal to 5.5% and less than or equal to 25.0%.

3. The display device of claim 1, further comprising a third display unit emitting a red light having a third output spectrum corresponding to the highest gray level of the display device, wherein an intensity integral of the third output spectrum within a range from 380 nm to 780 nm is defined as a third intensity integral, a ratio of the second intensity integral to the third intensity integral is defined as a second ratio, and the second ratio is greater than 0% and less than or equal to 29.0%.

4. The display device of claim 3, wherein the second ratio is greater than or equal to 6% and less than or equal to 29.0%.

5. The display device of claim 1, wherein a value of full width at half maximum corresponding to a maximum peak of the first output spectrum is different from a value of full width at half maximum corresponding to a maximum peak of the second output spectrum.

6. The display device of claim 1, wherein a mixed output spectrum is a mixture spectrum of the first output spectrum and the second output spectrum, and a wavelength corresponding to a maximum peak of the mixed output spectrum is equal to a wavelength corresponding to a maximum peak of the second output spectrum.

7. The display device of claim 1, wherein an intensity of a maximum peak of the first output spectrum is less than an intensity of a maximum peak of the second output spectrum.

8. The display device of claim 1, wherein the second output spectrum has a main wave and a sub wave, and an intensity of a maximum peak of the main wave is greater than an intensity of a maximum peak of the sub wave, wherein a wavelength corresponding to the maximum peak of the sub wave of the second output spectrum is different from a wavelength corresponding to a maximum peak of the first output spectrum.

9. The display device of claim 8 wherein a value of full width at half maximum corresponding to a maximum peak of the first output spectrum is different from a value of full width at half maximum corresponding to a maximum peak of the sub wave of the second output spectrum.

10. The display device of claim 1, further comprising a third display unit emitting a red light having a third output spectrum corresponding to the highest gray level of the display device, wherein the second output spectrum has a main wave and a sub wave, an intensity of a maximum peak of the main wave is greater than an intensity of a maximum peak of the sub wave, and a wavelength corresponding to the maximum peak of the sub wave of the second output spectrum is different from a wavelength corresponding to a maximum peak of the third output spectrum.

11. The display device of claim 1, further comprising:
    a first substrate;
    a second substrate disposed opposite to the first substrate;
    a light modulating layer disposed between the first substrate and the second substrate; and
    a backlight module disposed adjacent to the first substrate, wherein the first display unit and the second display unit respectively comprise a portion of the backlight module and a portion of the light modulating layer.

12. The display device of claim 11, further comprising a light conversion layer, wherein the light conversion layer is disposed between the backlight module and the first substrate or disposed on a surface of the second substrate opposite to the light modulating layer, and the first display unit and the second display unit respectively further comprise a portion of the light conversion layer.

13. The display device of claim 12, wherein the portion of the light conversion layer comprised in the second display unit includes a color adjusting material, and the color adjusting material makes the second output spectrum of the blue light have at least two peaks.

14. The display device of claim 1, further comprising:
a substrate;
a circuit disposed on the substrate; and
a plurality of light sources disposed on the substrate and electrically connected to the circuit,
wherein the first display unit and the second display unit respectively comprise one of the light sources and a portion of the circuit.

15. The display device of claim 14, wherein the light source comprised in the second display unit includes a color adjusting material, and the color adjusting material makes the second output spectrum of the blue light have at least two peaks.

16. The display device of claim 14, further comprising a light conversion layer disposed on the light sources or disposed between the light sources and the substrate, wherein the first display unit and the second display unit respectively further comprise a portion of the light conversion layer.

17. The display device of claim 16, wherein the portion of the light conversion layer comprised in the second display unit includes a color adjusting material, and the color adjusting material makes the second output spectrum of the blue light have at least two peaks.

18. A display device, comprising:
a first display unit emitting a red light having a first output spectrum corresponding to a highest gray level of the display device; and
a second display unit emitting a blue light having a second output spectrum corresponding to the highest gray level of the display device,
wherein an intensity integral of the first output spectrum within a range from 380 nm to 780 nm is defined as a first intensity integral, an intensity integral of the second output spectrum within a range from 494 nm to 580 nm is defined as a second intensity integral, a ratio of the second intensity integral to the first intensity integral is greater than 0% and less than or equal to 28.0%.

19. The display device of claim 18, wherein the ratio is greater than or equal to 2.6% and less than or equal to 28.0%.

20. The display device of claim 18, wherein a value of full width at half maximum corresponding to a maximum peak of the first output spectrum is different from a value of full width at half maximum corresponding to a maximum peak of the second output spectrum.

* * * * *